US012754231B2

(12) United States Patent
Skender

(10) Patent No.: US 12,754,231 B2
(45) Date of Patent: Oct. 6, 2026

(54) TESTING SYSTEM FOR DETECTING A FAULT AND A LOCATION OF THE FAULT

(71) Applicant: KARL STORZ Imaging Inc., Goleta, CA (US)

(72) Inventor: Maxim Jay Skender, Ventura, CA (US)

(73) Assignee: KARLZ STORZ Imaging Inc., Goleta, CA (US)

( * ) Notice: Subject to any disclaimer, the term of this patent is extended or adjusted under 35 U.S.C. 154(b) by 205 days.

(21) Appl. No.: 18/645,143

(22) Filed: Apr. 24, 2024

(65) Prior Publication Data

US 2025/0189573 A1 Jun. 12, 2025

Related U.S. Application Data

(60) Provisional application No. 63/607,199, filed on Dec. 7, 2023.

(51) Int. Cl.
*G01R 31/28* (2006.01)

(52) U.S. Cl.
CPC ................................ *G01R 31/2818* (2013.01)

(58) Field of Classification Search
CPC .................................................. G01R 31/2818
See application file for complete search history.

(56) References Cited

U.S. PATENT DOCUMENTS

| | | | | |
|---|---|---|---|---|
| 6,307,472 | B1 * | 10/2001 | Robertson ................ | G08B 7/06 340/569 |
| 6,933,730 | B2 * | 8/2005 | Parker ................ | G01R 31/2853 324/537 |
| 9,176,171 | B2 * | 11/2015 | Bickel .................. | G01R 21/133 |
| 2002/0118031 | A1 * | 8/2002 | Sweeney ................ | G01R 31/52 324/763.01 |
| 2002/0163327 | A1 * | 11/2002 | Novak ............... | G01R 31/2822 324/754.07 |
| 2006/0273818 | A1 * | 12/2006 | Takemoto ........ | G01R 31/31926 324/762.02 |
| 2018/0095122 | A1 * | 4/2018 | Gan ................... | G01R 31/2853 |
| 2022/0086577 | A1 * | 3/2022 | Ramamurthy ......... | G01R 31/52 |

* cited by examiner

*Primary Examiner* — Dominic E Hawkins
(74) *Attorney, Agent, or Firm* — David N. Villalpando; Jason Worgull; Jacqueline Cohen

(57) ABSTRACT

A testing system including a testing apparatus and a controller for detecting a location of a fault in printed circuit board is provided. The printed circuit board includes at least two nodes each including a signal output, a ground output and a location output. The testing apparatus includes a signal input, a ground input and a location input configured to engage a corresponding signal input, ground input and location output of the nodes. The controller is electrically coupled to the testing apparatus and is configured to receive a test signal from the signal input, a reference ground from the ground input and a location from the location input, wherein the controller is further configured to process a signal from the location output and a signal received by the signal input, wherein the controller provides a location of the node where a fault is detected.

19 Claims, 8 Drawing Sheets

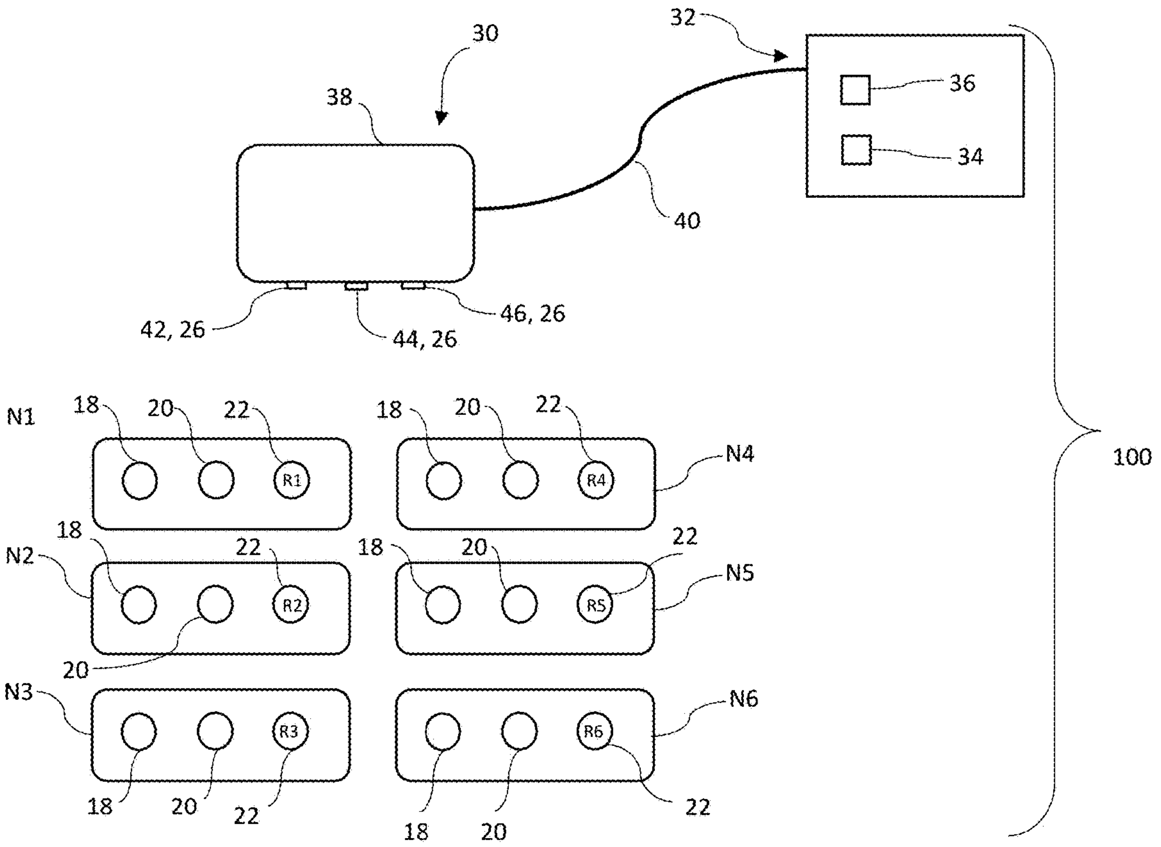
FIG. 2A
FIG. 2B
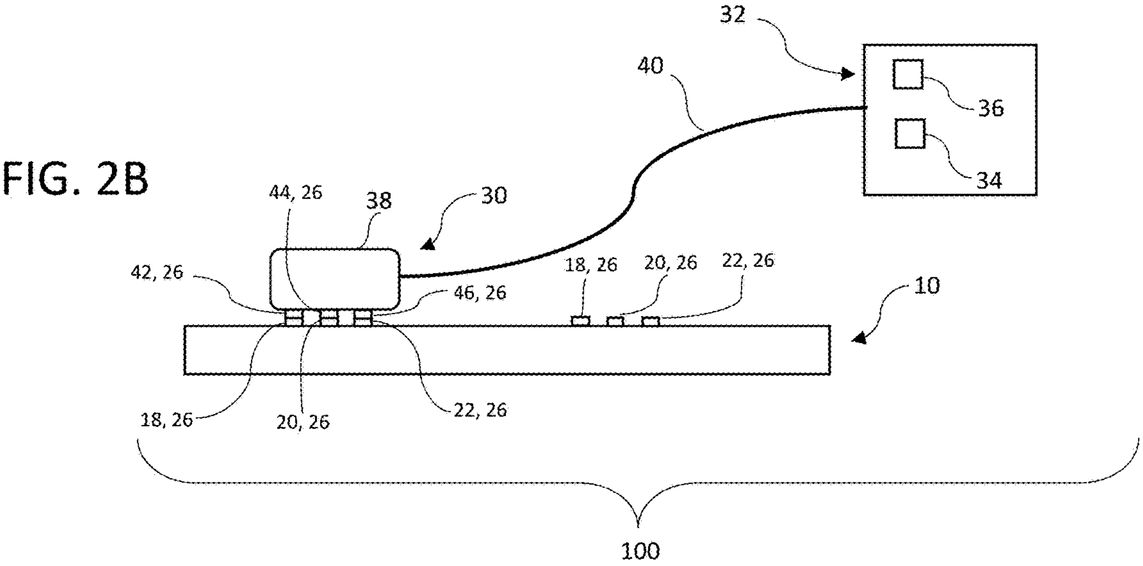

TESTING SYSTEM FOR DETECTING A FAULT AND A LOCATION OF THE FAULT

TECHNICAL FIELD

The present disclosure generally relates to equipment for testing circuits. More specifically, the disclosure relates to a testing system for testing printed circuit boards and assemblies, central control unit circuitry, circuit card assemblies, etc., and methods for the same.

BACKGROUND

It is well known in the electronics industry that electrical testing of circuits is required. This testing is done to ensure the quality of the product at various stages in the manufacturing process. Finished electronic products are typically comprised of both passive circuit elements and active semiconductor devices. Passive circuit elements include, without limitation, elements such as resistors and capacitors. Active semiconductor devices include, without limitation, devices such as transistors and integrated circuits. These elements and devices are usually physically mounted on a substrate. The substrate provides mechanical support and electrical interconnection between the elements and devices. The electrical testing of the interconnections is required to verify that the conductive traces, individual elements, and complete assemblies have the desired design characteristics. For example, resistors may be tested to ensure that the actual resistance is within the prescribed limits, and the conductivity of a conductive trace may be tested to verify its conductivity and the absence of a short.

A printed circuit board (PCB) is typically comprised of alternating layers of copper and polymer resin, the latter of which may be reinforced for enhanced mechanical and thermal properties. An example of this type of PCB is the common rigid board known as a "motherboard."

Semiconductor circuits are typically composed of a base substrate or wafer, formed of silicon or other semi-conducting material. Circuit elements such as transistors, resistors and capacitors are built up through varied processes. Such processes include layer deposition, patterning, implantation, and metallization. Once built up, the wafer is subsequently diced into individual integrated circuits (ICs).

Complete electronic circuits may be comprised of several of these boards and circuits connected together and/or mounted on one another. For example, a microprocessor die may be mounted on a small PCB and the small PCB may mounted to a main PCB.

In order to keep the expense associated with rejected parts low, it is advantageous to perform electrical testing at the device or sub-component level. Most PCB production also includes a final integrity test. The finished PCB product is only considered complete after final testing.

One method/system used to test PCBs has become known as "bed of nails" testing. The "bed of nails" is in actuality a fixture with fixed test probes that contact all of the conductive traces and/or test nodes. The system uses the probes to determine whether the tested item (traces or device) passes its respective test. This type of testing system is specific to an individual PCB construction and must be uniquely constructed for each different PCB construction.

Because of the above and other limitations of bed of nails testing, an alternative testing system, one based on moving probes, was developed. This testing system is known as "flying probe testing."

Flying probe testing performs active testing of a circuit or circuit element (resistors, capacitors, conductive traces, etc.) that are mounted on a substrate PCB. This testing is done without the need for building a custom fixture for the specific PCB construction. Instead, flexible and programmable robotic systems move probes, under software control specific to the PCB construction, to measure characteristics of individual traces or device under test (DUT) on the PCB.

Flying probe systems work by positioning the PCB, including the DUT, in fixed position in a test apparatus. The probe assembly is moved about the DUT and positions the two probes at predetermined test sites consisting of two points or nodes on the DUT. Positioning of the probes requires moving each of the probes and their respective probe mounts in X, Y and Z directions, as well as rotating the probes and mounts about corresponding axes for proper orientation in order to access the nodes of the test site. Once positioned, a test signal is applied to test points by the probes and a return signal is received from the test points testing system. The received signal is then analyzed to determine if a fault or defective element exists at the test location. The probes are then repositioned at the next predetermined testing site and testing of that location performed. The process repeats for the remaining test sites. This technique allows finely spaced and accurate automated probing based on programmed probing locations.

Although slower than the bed of nails testing, flying probe tests are commonly used because of their lower cost. Flying probe testing also offers functionality and flexibility in being able to be used with a wide range of DUTs, including PCBs, PCB assemblies, circuit card assemblies, central control unit circuitry, and others.

Regardless of the testing method and the DUT, probing is error prone and time consuming. When the DUT includes permanent analog probing traces, the number of PCB layers in the DUT increases and testing is subject to high noise levels. Vision systems may be employed with the testing method to locate and select the location or node that is to be contacted by the probes, but flying probe systems, with their probe mounts, can impede the use of vision systems. This is further complicated when the DUT is highly populated with elements to be probed.

Thus, there arises the need for an improved probing system and method that overcomes limitations of existing probing techniques. If probing location information can be incorporated into the probing system and method, error rates can be reduced and noise levels accounted for.

SUMMARY

In one aspect, a device for accommodating an electric circuit is provided. The device includes a printed circuit board, at least one electric component mounted on the printed circuit board, and at least two nodes disposed on the printed circuit board. An electric trace electrically couples the nodes to each other. The at least one electric component is also electrically coupled to the electric trace so as to form an electric circuit. Each of the nodes include a signal output, a ground output and a location output.

The device may include one or more of the following optional features. For instance, in one aspect of the device, the location output includes a first resistor and the resistance value of each of the resistors is different from each other so as to identify the location of the node in which the fault is detected. In another aspect, each of the at least two nodes are dimensioned the same as each other, wherein the signal output, the ground output and the location output are spaced apart from each other.

In one aspect, the signal output, the ground output and the location output may be formed by one of a respective via and a respective contact.

In one aspect, the printed circuit board may further include a plurality of reference inputs. Each of the plurality of reference inputs is assigned a location value. The printed circuit board may further include a location trace electrically connecting each of the location output to a corresponding reference input.

In another aspect of the disclosure, a testing system for detecting a location of a fault is provided. The testing system includes a printed circuit board including at least one electric component and at least two nodes. The electric component and the nodes are mounted on the printed circuit board and an electric trace electrically couples the nodes and the electric components to each other. Each node includes a signal output, a ground output and a location output.

The testing system further includes a testing apparatus and a controller. The testing apparatus includes a signal input, a ground input and a location input configured to engage a corresponding signal input, ground input and location output of the at least two nodes. The controller is electrically coupled to the testing apparatus and is configured to receive a test signal from the signal input, a reference ground from the ground input and a location from the location input, wherein the controller processes a signal from the location output and a signal received by the signal input to determine a fault and/or location, wherein the controller provides a location of the node in which a fault is detected.

In one configuration, the location output includes a first resistor and the resistance value of each of the resistors is different from each other so as to identify the location of the node in which the fault is detected.

In another configuration, the location input includes a resistor arranged in parallel with the resistor of the location output.

In yet another configuration, each of the at least two nodes are dimensioned the same as each other. In such a configuration, the signal output, the ground output and the location output are spaced apart from each other and the signal output, the ground output and the location output are formed by a respective via. Alternatively, the signal output, the ground output and the location output may be formed by a respective contact, the contact being an electrically conductive material.

In yet another configuration, the printed circuit board includes a plurality of reference inputs, each of the plurality of reference inputs is assigned a location value, and a location trace electrically connects each of the location output to a corresponding location value. The testing apparatus may further include an interface for engaging each one of the reference inputs, wherein the location input grounds a respective reference input when the testing apparatus is inserted into a respective one of the at least two nodes so as to provide a location of a fault.

In one configuration, the location input includes a second resistor arranged in series with the corresponding location trace.

In one configuration, each of the nodes are dimensioned the same as each other. In such a configuration, the signal output, the ground output and the location output are spaced apart from each other.

In one configuration, the signal output, the ground output and the location output are formed by a respective via. Alternatively, the signal output, the ground output and the location output may be formed by a respective contact, the contact being an electrically conductive material.

In another aspect, a method of testing a device is provided. The device includes a printed circuit board having an electric trace and a plurality of electronic components. The method includes providing at least two nodes on the electric trace, wherein each of the nodes includes a signal output, a ground output and a location output. The method includes providing a testing apparatus including a signal input, a ground input and a location input. The method includes receiving at a controller a test return signal from the signal output, a reference ground from the ground output and a location from the location input, wherein the controller is configured to provide a location of the at least two nodes in which a signal received by the signal input is a fault.

The method may include one or more of the following optional features. For example, the location output may include a first resistor and the resistance value of each of the first resistors is different from each other so as to identify the location of the node in which the fault is detected.

In one configuration, the location input includes a second resistor arranged in parallel with the first resistor of the location output.

In one configuration, each of the nodes are dimensioned the same as each other. For instance, the signal output, the ground output and the location output may be spaced apart from each other in each of the at least two nodes and the signal output, the ground output and the location output are formed by a respective via. Alternatively, the signal output, the ground output and the location output may be formed by a respective contact, the contact being an electrically conductive material.

In one configuration, the printed circuit board includes a plurality of reference inputs, each of the reference inputs is assigned a location value, and a location trace electrically connects each of the location output to a corresponding location value. In such a configuration, the testing apparatus may further include an interface for engaging each one of the reference inputs, wherein the location input grounds a respective reference input when the testing apparatus is inserted into a respective one of the at least two nodes so as to provide a location of a fault. Further, the input may include a second resistor arranged in parallel with the corresponding location trace.

In one configuration, each of the two nodes are dimensioned the same as each other. For instance, the signal output, the ground output and the location output are spaced apart from each other and the signal output, the ground output and the location output may be formed by a respective via. Alternatively, the signal output, the ground output and the location output are formed by a respective contact, the contact being an electrically conductive material.

The details of one or more implementations of the disclosure are set forth in the accompanying drawings and the description below. Other aspects, features, and advantages will be apparent from the description and drawings, and from the claims.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

FIG. 2A is a diagrammatic representation of an analog implementation of a circuit board, testing apparatus and system embodying the principles described herein;

FIG. 2B is a depiction showing the testing apparatus testing the first node of the circuit board shown in FIG. 2A.

DETAILED DESCRIPTION OF PREFERRED EMBODIMENTS

A testing system and method for determining a location of a fault in a device such as a printed circuit board is provided. The system and method includes a testing apparatus configured to probe each node disposed on the printed circuit board. The node includes a signal output, a ground output, and a location output. The testing apparatus processes the fault signal and a signal from the location output to determine the location of a fault on the printed circuit board. The location may be determined by processing an analog signal or a digital signal.

Figure 1:
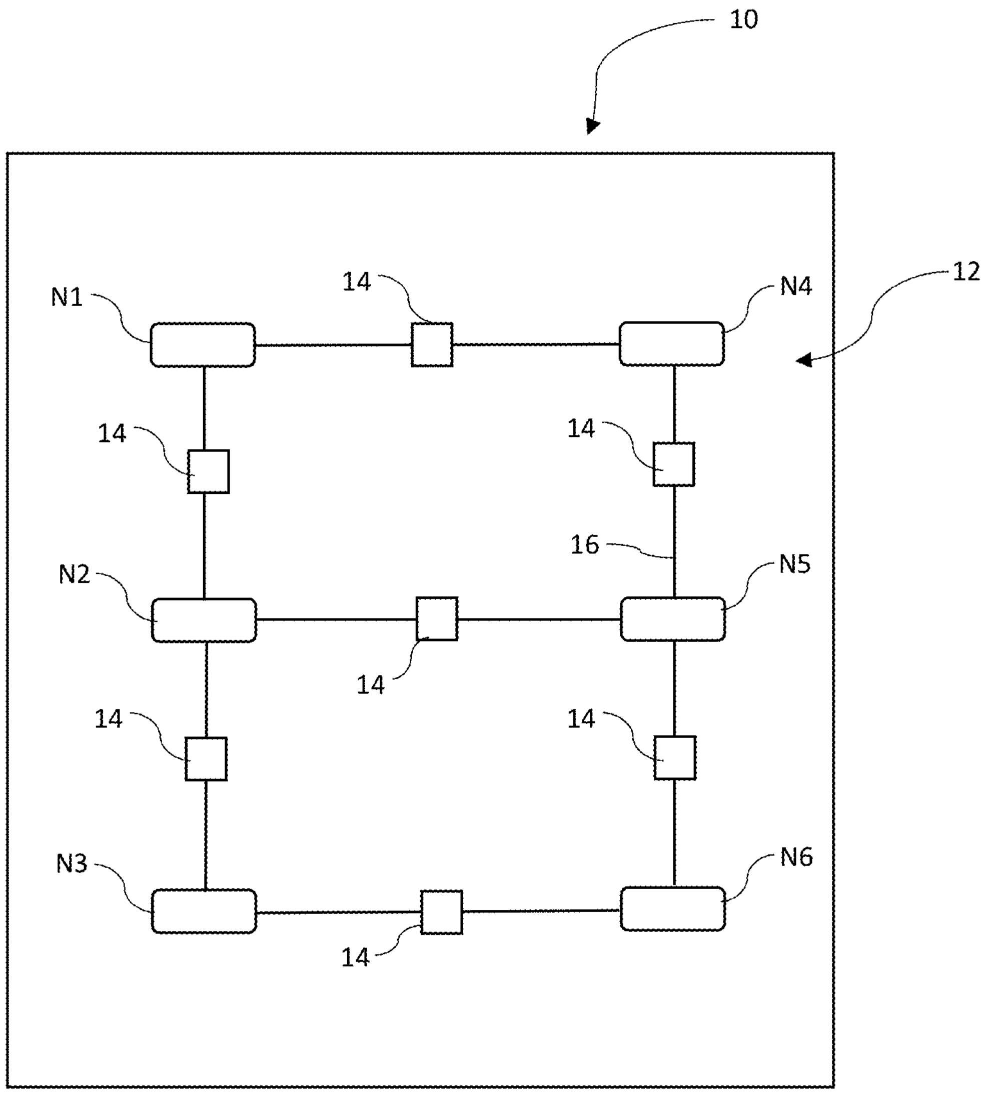
FIG. 1 is a schematic representation of a printed circuit board according to one or more aspects described herein.
Figure 4:
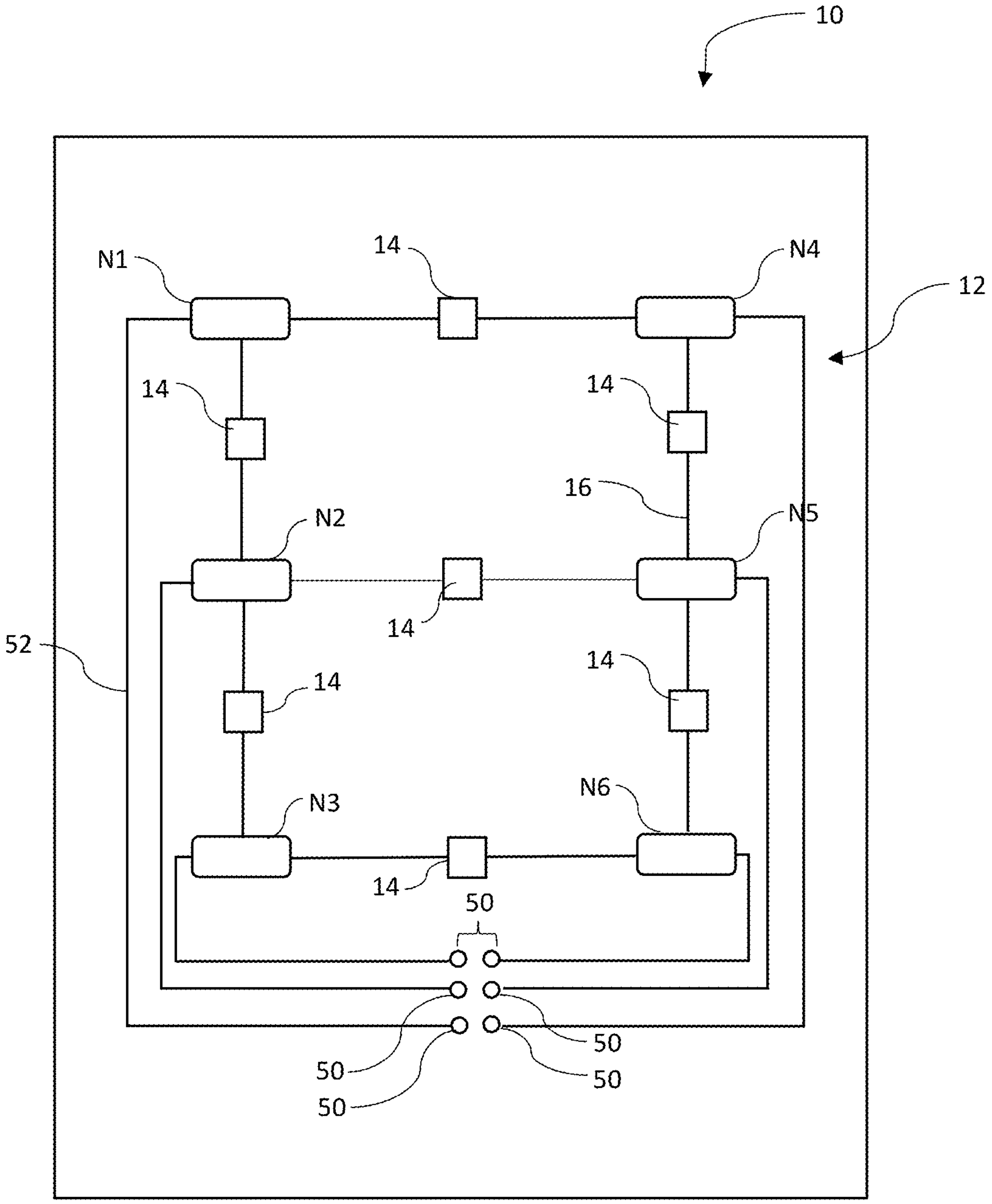
FIG. 4 is a schematic representation of a printed circuit board according to a second aspect described herein.

With reference first to FIGS. 1 and 4, a device 10 for accommodating an electric circuit 12 is provided. In particular, the device 10 is a substrate such as a printed circuit board. For clarity, the printed circuit board is also referenced as "10". Any substrate currently known or later developed may be adapted for use herein. The electric circuit 12 includes at least one electric component 14 and at least two nodes "N" mounted on the printed circuit board. As used herein, the nodes will be referenced by "N" generally and "N1", "N2", "N-number" specifically. The electric component 14 may include passive and active components such as integrated circuits, capacitors, diodes, resistors, switches and the like. The nodes "N" and the electric components 14 are disposed on a top surface of the printed circuit board 10 and are communicatively coupled to each other by a conductive line 16, such as an electric trace. For clarity, the electric trace is also referenced as "16".

With reference again to FIG. 1 and now to FIG. 2A, each of the nodes "N" include a signal output 18, a ground output 20 and a location output 22. When the printed circuit board 10 is energized, or otherwise powered, an electric current runs through the nodes "N" and the electric components 14. In an instance where there is a fault, a signal (such as a current or voltage) may be irregular. In such a case, identifying the defective part/electric component 14 may be accomplished by determining the node "N" associated with the fault. The signal may be transmitted through the signal output 18 of each node "N" and may be measured by reference to the ground output 20 which is connected to ground. The location of each of the nodes "N" is transmitted or otherwise identified by the location output 22. Thus, when a fault is detected at a particular node "N", a general location of the fault is provided by the location node "N". The location may be provided by processing an analog or digital signal.

With reference again to FIGS. 1 and 2A, and now to FIGS. 2B-3C, the device 10 is configured to determine the location of a node "N" by processing an analog signal. In such an aspect, the location output 22 of each of the nodes "N" includes a first resistor 24 that is electrically coupled to the electric trace 16 and the resistance value of each of the first resistors 24 is different from every other first resistor 24, so as to provide a unique resistance value associated with each node and thereby to identify the location of the node "N" in which the fault is detected. In particular, as each of the first resistors 24 has a resistance value that is different from every other first resistor 24, the location of the node "N" may be determined.

The node "N" may be formed by three separate contacts or contact pads 26 or three separate vias 28, and in some embodiments, the nodes may be made up of a combination of contacts or contact pads 26 and vias 28. Each of the nodes "N" may be dimensioned to be the same as other nodes, wherein the signal output 18, the ground output 20 and the location output 22 are spaced apart from each other. Each of the signal output 18, the ground output 20 and the location output 22 may be formed by a via 28 or a contact 26. The contacts 26 are formed of an electrically conductive material such as copper, gold, or the like. In the instance of a contact 26, the contacts 26 may be circular and formed on the top surface of the printed circuit board 10 and the electric trace 16 connects the signal output 18 to an analog or digital input thereby measuring the signal output circuit board 10 at this node. The electric trace 16 also connects the ground output 20 to ground and the location output 22 to ground, wherein the first resistor 24 is interposed between the location output 22 and ground. Likewise, in an instance where the signal output 18, the ground output 20 and the location output 22 are formed by a via or pad 28, the electric trace 16 may be formed along the via or pad 28 and connects the signal output 18 to an analog or digital input thereby measuring the signal output, connects the ground output 20 to ground and connects the location output 22 to second analog or digital input thereby measuring the location resistor value, wherein the first resistor 24 is interposed between the location output 22 and ground.

FIG. 1 provides an example of a device 10 having six (6) nodes "N" (a first node "N1", a second node "N2", a third node "N3", a fourth node "N4", a fifth node "N5" and a sixth node "N6") and seven electric components 14 coupled to together by an electric trace 16. It should be appreciated that the number of nodes "N" and electric components 14 disposed on the device 10 are illustrative and are not limiting to the scope of the appended claims.

FIG. 2A provides an illustration showing a testing system 100 and a method 200 of testing the device 10, wherein the nodes "N" shown in isolation, independent of the device 10 to facilitate an understanding of the operation of the testing system 100. The testing system 100 includes the printed circuit board 10 (not shown in FIG. 2A) to be tested and a testing apparatus 30 for testing the printed circuit board 10. The testing apparatus 30 is electrically coupled to a controller 32 configured to process the signals detected by the testing apparatus 30. The testing apparatus 30 is configured to probe each of the nodes "N" and is illustratively shown as being a unit separate from the controller 32. However, it should be appreciated that the testing apparatus 30 and the controller 32 may be formed as a singular unit. Also, the signals being measured may also include differential signals by adding an additional signal contact thereby allowing differential signal measurements to be made. In such embodiments, the controller is also adapted to measure differential signals. It should be appreciated that the controller may in fact be controlling a standard piece of test equipment (such as oscilloscopes, multi-meters, curve tracers, etc.) to perform the signal measurements, thereby expanding the range and accuracy of parameters to be measured.

The testing system 100 is configured to detect a fault in the electric circuit 12. It should be appreciated that the fault may be determined by measurement of any electric parameter, such as voltage, resistance, duty-cycle and the like. In other words, each node "N" is tested to determine a value at the node "N" provided by the signal output 18 and the location of the node "N" is provided by the location output 22. Thus, in instances where a resistance is tested, a resistance value is output at the signal output 18. The measured resistance value is processed by a controller 30 to determine if the measured resistance value is within an acceptable threshold. Likewise, in instances where a voltage is tested, a voltage value is output at the signal output 18. The measured voltage value is processed by a controller 30 to determine if the measured voltage value is within an acceptable threshold. It should be appreciated that any electric parameter may be tested. When the measured value is outside of the acceptable threshold, a fault is indicated as well as the location of the fault.

The controller 32 includes memory hardware 34 and data processing hardware 36 in communication with the memory hardware 34. The memory hardware 34 stores instructions that, when executed on the data processing hardware 36, cause the data processing hardware 36 to perform operations including processing a signal from the signal output 18 to determine a fault and processing a signal from the location output 22 to determine the node "N" at which the fault is detected/determined.

FIG. 2A illustrates the testing apparatus 30 in a position to probe each of the nodes "N". The testing apparatus 30 is illustratively shown as having a housing 38 configured to hold electrical components (not shown). In one aspect, a cable 40 including conductive elements connects the housing 38 to the controller 32 so as to receive an electric signal from the printed circuit board 10 and transmit the electrical signal to the controller 32. It should be appreciated that the housing 38 may be, additionally or alternatively, wirelessly coupled to the controller 32 using any known wireless communication protocol such as Bluetooth or WiFi.

The testing apparatus 30 includes a signal input 42, a ground input 44 and a location input 46 which are illustratively shown as contacts 26 extending from a bottom surface of the housing 38. Such an aspect may be desirable in instances where the signal output 18, a ground output 20 and a location output 22 are contacts 26 formed in the printed circuit board 10. However, in instances where the signal output 18, a ground output 20 and a location output 22 are formed by a via 28 (see FIG. 5A), the signal input 42, the ground input 44 and the location input 46 may be formed as prongs or male terminals. The signal input 42, the ground input 44 and the location input 46 may be formed of an electrically conductive material such as steel, copper or the like and are configured to engage a corresponding signal output 18, ground output 20 and location output 22 of a node "N" to be tested.

The controller 32 is electrically coupled to the testing apparatus 30 and is configured to receive a test signal from the signal output 18 to the signal input 42, a reference ground from the ground output 20 to the ground input 44 and a location from the location output 22 to the location input 46 when the testing apparatus 30 is engaged with a respective node "N". The controller 32 processes a signal from the location output 22 and a signal (voltage, resistance, duty-cycle and the like) from the signal output 18 and provides a location of the node "N" in which a fault is detected. In one aspect, the controller 32 may be configured to transmit the results to a display, a robot, a controller, a computer database, an email address, or the like.

FIG. 2B shows the testing apparatus 30 engaged with the first node "N1". Since the first resistors 24 of the nodes "N" have a different resistance value, the location of the node "N" may be determined by processing a voltage or a resistance. In such an aspect, the resistance value associated with each of the first resistors 24 may be stored in the memory hardware 34 and a fault signal associated with a voltage reading indicative of the resistance value may be processed to determine the node "N" and thus the location in which the fault occurred. For example, the testing apparatus 30 or the controller 32 may be configured to transmit a current through the location input 46 into the location output 22, through the first resistor 24 and into ground resulting in a voltage "V" at the first resistor 24. The voltage "V" may be measured by either the testing apparatus 30 or the controller 32 to determine at which node "N" the fault occurred. In one aspect, the voltage may be processed to calculate the resistance value at the node "N". In such an aspect, the current transmitted through the location input 46 remains the same, in which case the voltage "V" reading changes with each node "N" as the first resistors 24 have different resistance values and the location of the node "N" in which the fault is detected is determined. In this example, since there are six (6) nodes "N" there are six associated voltages "V1", "V2", "V3", "V4", "V5", and "V6" which have different values. Thus, the memory hardware 34 may store the voltage readings at each node "N" and the data processing hardware 36 processes the voltage values to determine with which of the nodes "N" the fault is associated.

In one aspect, the location input 46 includes a second resistor 48 arranged in series with the first resistor 24 of the location output 22. The second resistor 48 is configured to operate in combination with the first resistor 24 as a voltage divider and may serve as what is commonly known as a pull-up resistor so as to provide a known state to the location input 46. The pull-up resistor may be located externally or internally to the controller as needed. If the probe is not connected to the circuit then it will read a high or pulled up level indicating a probe that is not connected properly or a fault in the reading of the location resistor.

With reference again to FIGS. 2A and 2B, each of the nodes "N" are dimensioned the same as each other. FIG. 2B shows the testing apparatus 30 probing the first node "N" of the printed circuit board 10, wherein the testing apparatus 30 includes three contacts 26 defining the signal input 42, the ground input 44 and the location input 46. The signal output 18, the ground output 20 and the location output 22 are formed by a respective contact 26 and are spaced apart from each other. Each contact 26 is configured to engage a respective signal output 18, ground output 20 and location output 22.

Figure 3A:
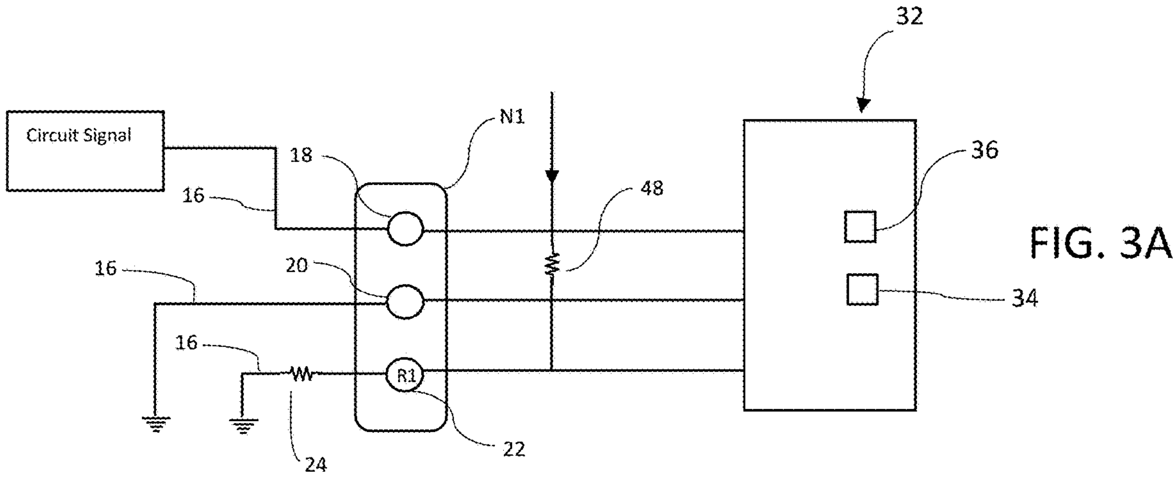
FIG. 3A is a schematic depiction showing the testing apparatus probing the first node shown in FIG. 2B.
Figure 3B:
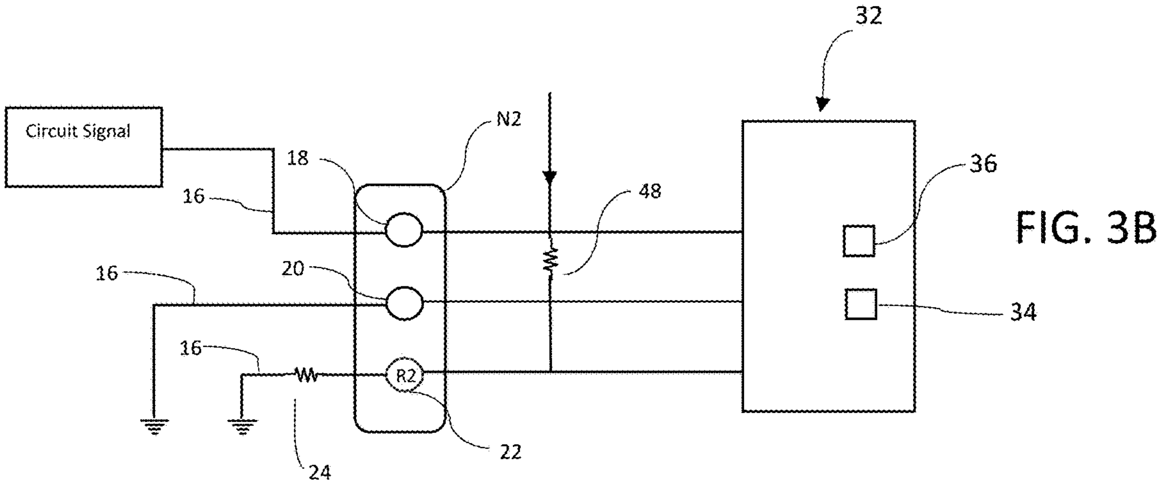
FIG. 3B is a schematic depiction showing the testing apparatus probing the second node shown in FIG. 2B.
Figure 3C:
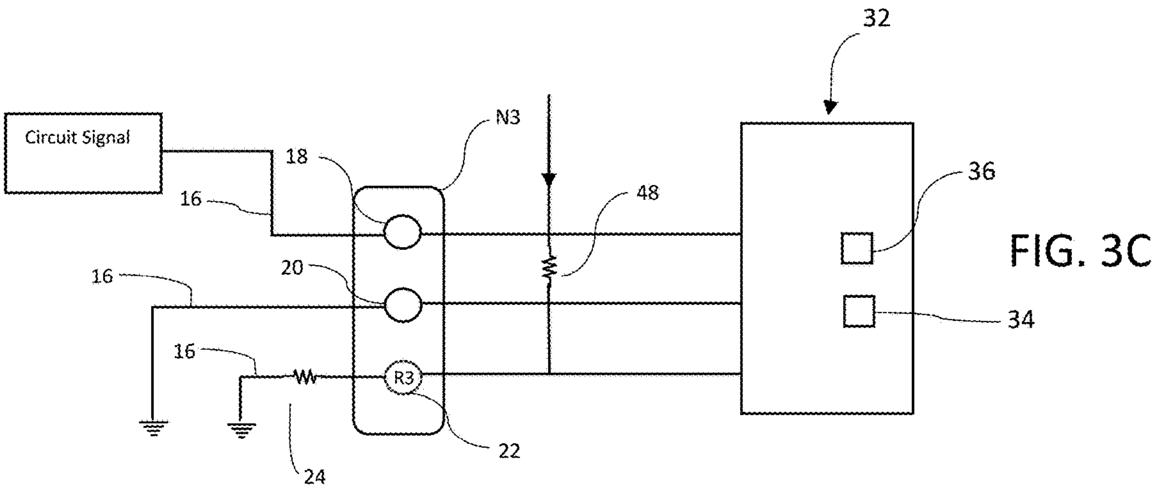
FIG. 3C is a schematic depiction showing the testing apparatus probing the third node shown in FIG. 2B.

With reference now to FIGS. 3A-3C, an operation of the testing system 100 processing an analog signal is provided. For illustrative purposes, the testing system 100 is described as testing only three of the nodes "N" shown in FIG. 1, but it should be appreciated that the principles described may be applied to all of the nodes "N" of the printed circuit board 10. FIGS. 3A-3C show the testing apparatus 30 probing the first node "N1", the second node "N2" and the third node "N3" respectively. It should be appreciated that the testing need not be performed sequentially. When the testing apparatus 30 probes the node "N" an electrical connection is made between the signal output 18 of the node "N" and the signal input 42 of the testing apparatus 30, the ground output 20 of the node "N" and the ground input 44 of the testing apparatus 30 and the location output 22 of the node "N" and the location input 46 of the testing apparatus 30. The controller 32 is configured to process the signal from the signal output 18 to determine if the signal reading is incorrect, i.e., determine a fault. In instances, where the signal is a voltage, a defect may be determined when the voltage value is outside of a predetermined range. In instances where the signal is determined to be a fault the reading associated with location output 22 is processed to determine which the nodes "N" the fault occurred. As each of the first resistors 24 has a resistance value different from each other, voltages (V1, V2, V3 . . . ) read at each of the nodes "N" (N1, N2, N3 . . . ) are different from each other. Thus, the location of the detected fault may be determined.

Figure 5A:
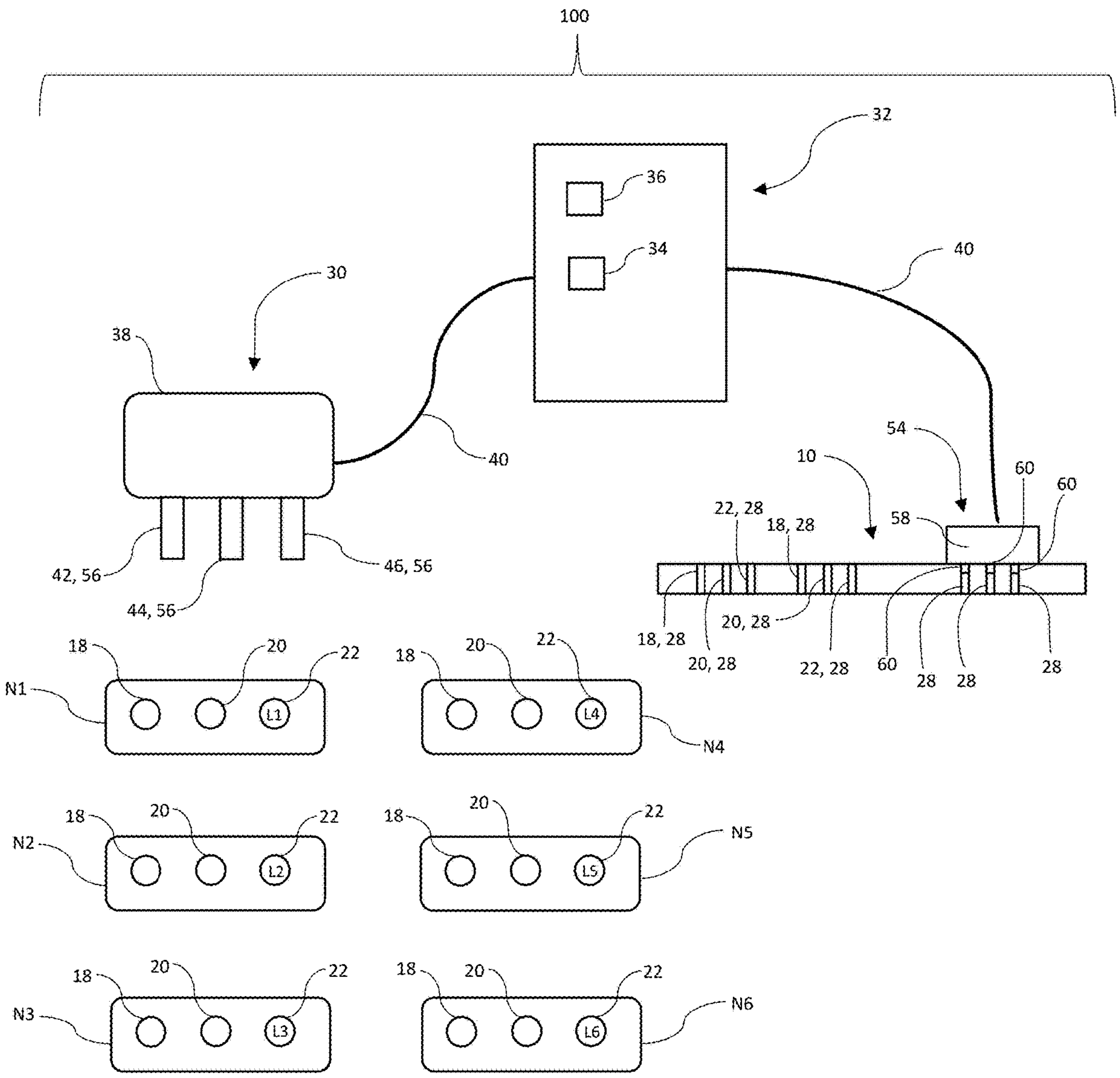
FIG. 5A is a diagrammatic representation of a digital implementation of a circuit board probing apparatus and system embodying the principles described herein.
Figure 5B:
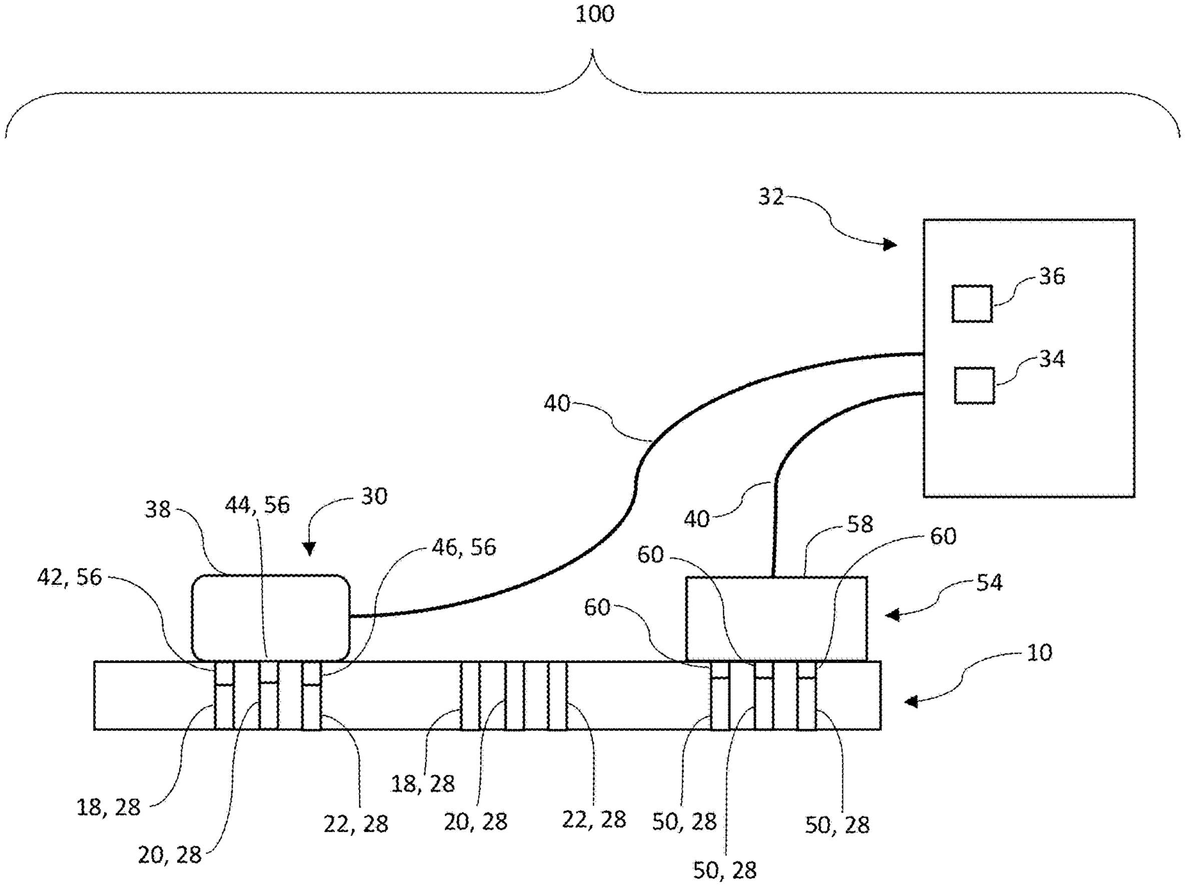
FIG. 5B is a depiction showing the testing apparatus testing the first node of the circuit board shown in FIG. 5A.
Figure 6:
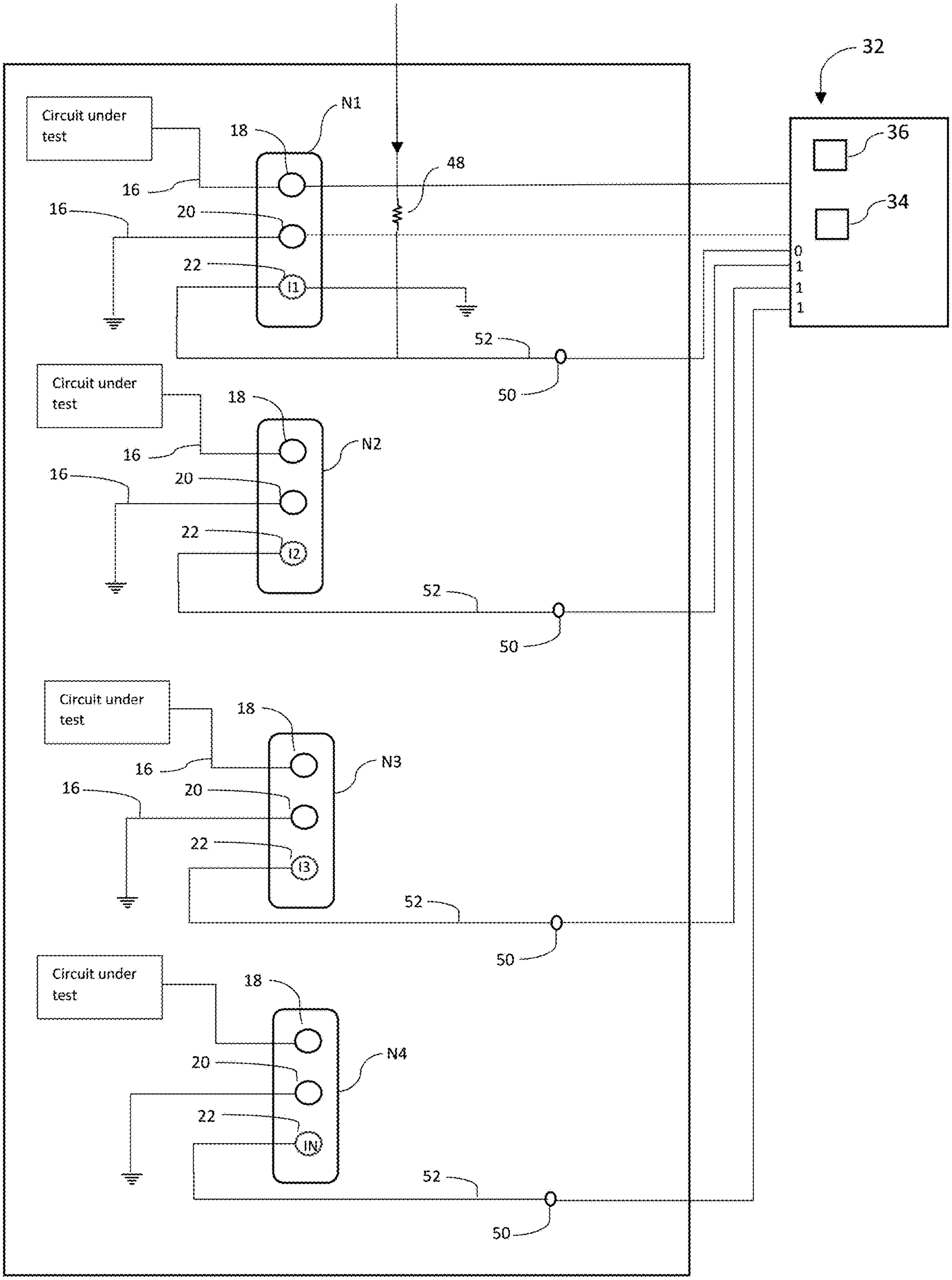
FIG. 6 is a schematic depiction showing the operation of the testing system shown in FIG. 5A.

With reference now to FIGS. 4-6 a description of the testing system 100 processing a digital signal is provided. In particular, the device 10 is configured to enable the determination the location of a node "N" by processing a digital signal. In such an aspect, the printed circuit board 10 further includes a plurality of reference inputs 50. Each of the plurality of reference inputs 50 is assigned a location value and a location trace 52 electrically connects each of the location outputs 22 to a corresponding reference input 50. For example, the printed circuit board 10 may be formed with sixteen (16) reference inputs 50, each of which are assigned a numerical value such as 1, 2, 3, 4 . . . . The reference inputs 50 may be formed by a via 28, a contact 26 or a pin (not shown). The contacts 26 and pins may be formed of an electrically conductive material such as copper, gold, or the like.

FIG. 4 provides an example of a device 10 having six (6) nodes "N" (a first node "N1", a second node "N2", a third node "N3", a fourth node "N4", a fifth node "N5" and a sixth node "N6") and seven electric components 14 coupled to together by an electric trace 16. It should be appreciated that the number of nodes "N" and electric components 14 disposed on the device 10 is illustrative and is not limiting to the scope of the appended claims. Each of the nodes "N" is electrically coupled to a respective reference input 50 by a location trace 52.

FIG. 5A provides an illustration showing a testing system 100 and a method 200 of testing the device 10, wherein the nodes "N" are isolated and each node "N" has a location value as indicated by "L1, L2, L3, L4, L5 and L6". The testing system 100 includes the printed circuit board 10 to be tested and a testing apparatus 30 for testing the printed circuit board 10. The testing apparatus 30 is electrically coupled to a controller 32 configured to process the signals detected by the testing apparatus 30. The testing apparatus 30 is configured to probe each of the nodes "N" and to be coupled with each of the reference inputs 50. In particular, the testing apparatus 30 includes a housing 38 and an interface 54. The housing 38 is configured to hold electrical components for processing a signal from the printed circuit board 10. A cable including electrical connections 40 connects the housing 38 and the interface 54 to the controller 32 so as to transmit the signal from the printed circuit board 10 to the controller 32.

The testing apparatus 30 includes a signal input 42, a ground input 44 and a location input 46 which are illustratively shown as prongs 56 extending from a bottom surface of the housing 38. The testing apparatus 30 is illustratively shown as being a unit separate from the controller 32. However, it should be appreciated that the testing apparatus 30 and the controller 32 may be formed as a singular unit.

The interface 54 may include a case 58, such as a wire harness connector, configured to accommodate connectors 60 for engaging the reference inputs 50 of the printed circuit board 10. The connectors 60 are electrically conductive members, and any such electrically conductive member currently known or later developed may be modified for use herein, illustratively including a terminal, a contact or the like. For illustrative purposes, the connectors 60 are shown as male terminals and the reference inputs 50 are shown as a via 28.

The controller 32 includes memory hardware 34 and data processing hardware 36 in communication with the memory hardware 34. The memory hardware 34 stores instructions that, when executed on the data processing hardware 36, cause the data processing hardware 36 to perform operations including processing a signal from the signal output 18 to determine a fault and processing a signal from the location output 22 to determine the node "N" at which the fault is detected/determined.

FIG. 5A illustrates the testing apparatus 30 in a position to probe any of the nodes "N" with the interface 54 engaged with the reference inputs 50. The controller 32 is electrically coupled to the testing apparatus 30 and the interface 54. The testing apparatus 30 is configured to receive a signal from the signal output 18 to the signal input 42, a reference ground from the ground output 20 to the ground input 44 and a location from the location output 22 to the location input 46 when the testing apparatus 30 is engaged with a respective node "N". The interface 54 is configured to engage each of the reference inputs 50 at the same time so as to receive a signal from each of the reference inputs 50. The controller 32 processes a signal from the location output 22 and a signal from the signal output 18 and provides a location of the node "N" under test. In one aspect, the controller 32 may be configured to transmit the results to a display, a computer database, a robot, an operator, an email address, or the like.

With reference now to FIGS. 5B and 6 a description of the testing system 100 is provided. To test the printed circuit board 10, the interface 54 is connected to the reference inputs 50. For instance, each connector 60 is placed into electrical contact with a respective reference input 50. With the interface 54 engaged, the signal input 42, the ground input 44 and the location input 46 may be used to engage a respective node "N". FIGS. 5B and 6 show a stage of the testing where the testing apparatus 30 is engaged with the first node "N1" while the interface 54 is engaged with the reference inputs 50. During the testing procedure, the interface 54 remains electrically connected to reference inputs 50 as the housing 38 is used to probe each of the nodes "N".

As with before, the printed circuit board 10 may be energized during the testing process. It should be noted that the aforementioned location resistors may be measured with or without the printed circuit board 10 being energized. The circuit under test, however, must be energized for certain circuit elements to be tested. When the interface 54 is electrically connected to the reference inputs 50, an electric signal is transmitted from each of the location outputs 22 to a respective reference input 50. When the housing 38 is connected to the first node "N1", the signal to the location output 22 is grounded, while all of the signal to the location outputs 22 of the other nodes "N" are transmitted to a respective reference input 50. Thus, the controller 32 reads a value of zero (0) at the first node "N1" and a value of one (1) at the reference inputs 50 corresponding to nodes "N2", "N3", and "N4". Thus, the controller 32 determines the location of a node "N" in which can be correlated to a detected fault. When the housing 38 is connected to the second node "N2", the controller 32 reads a value of zero (0) at the second node "N2" and a value of one (1) at the reference inputs 50 corresponding to nodes "N1", "N3", and "N4".

FIG. 6 shows an aspect where the location input 46 includes a second resistor 48 configured to operate as what is commonly known as a pull-up resistor so as to provide a known state to the location input 46.

Figure 7:
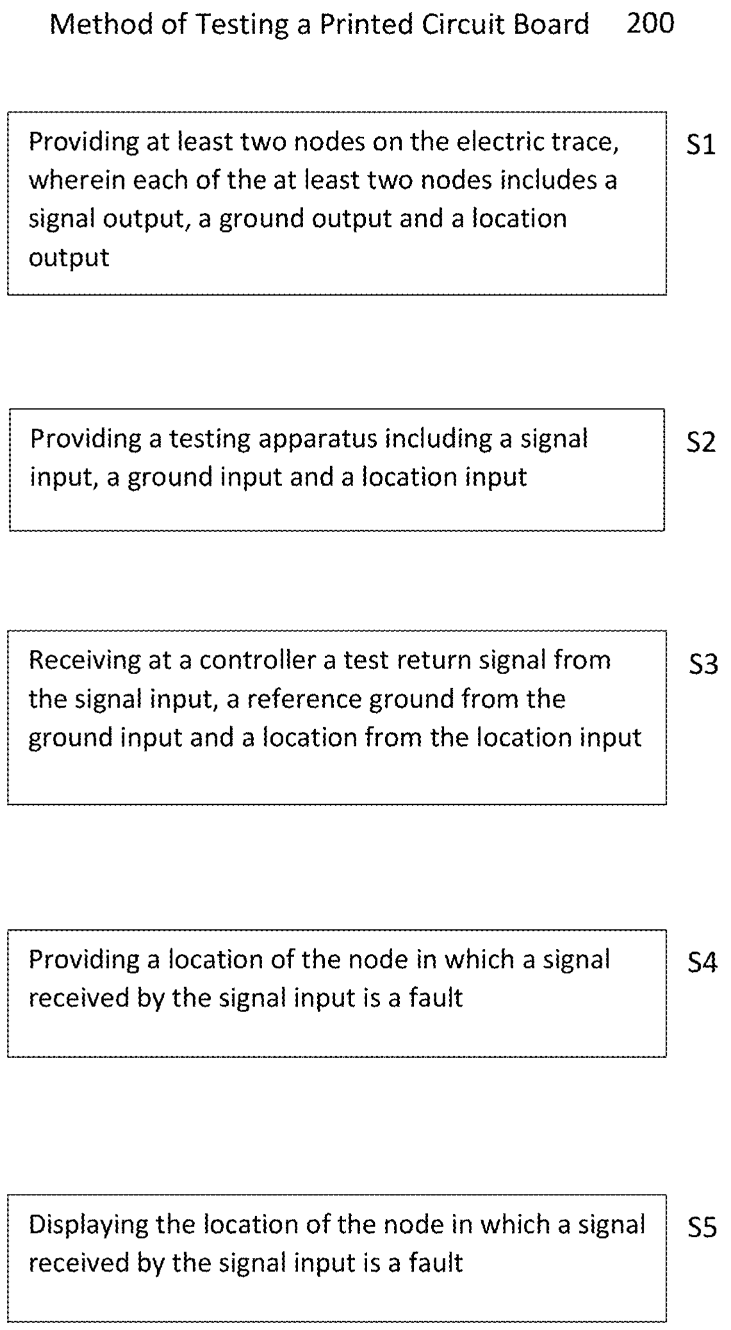
FIG. 7 is a diagram showing the steps of a method according to one or more aspects described herein.

With reference to FIG. 7, a method 200 of testing a printed circuit board 10 is provided. The printed circuit board 10 includes an electric trace 16 and a plurality of electronic components. The method 200 includes step S1 providing at least two nodes "N" on the electric trace 16, wherein each of the at least two nodes "N" includes a signal output 18, a ground output 20 and a location output 22. The nodes "N" are disposed on the printed circuit board 10. At step S2, the method 200 includes providing a testing apparatus 30 including a signal input 42, a ground input 44 and a location input 46.

At step S3 the method 200 includes receiving at a controller 32 a test return signal from the signal input 42, a reference ground from the ground input 44 and a location from the location input 46. At step S4, the method 200 includes providing a location of the at least one of the at least two nodes "N" in which a signal received by the signal input 42 is a fault. The method 200 may include step S5, displaying the location of the node "N" in which a signal received by the signal input 42 is a fault. This may be done by a printed readout of the testing, contemporaneously on a monitor as the fault is detected, logging into a computer database or the like. As described above, the location may be determined by processing an analog signal or a digital signal.

For example, in an aspect where an analog signal is processed, the location output 22 includes a first resistor 24 and the resistance value of each of the first resistors 24 is different from each other so as to identify the location of the node "N" in which the fault is detected. Thus, a current is transmitted to the location input 46 wherein a voltage at each of the location inputs 46 are different from each other. Thus, the location at which a fault is detected may be known by processing the voltage value.

In an aspect where a digital signal is processed, the printed circuit board 10 further includes a plurality of reference inputs 50, each of the plurality of reference inputs 50 is assigned a location value, and a location trace 52 electrically connects each of the location output 22 to a corresponding location value. In such a configuration, the testing apparatus 30 may further include an interface 54 for engaging each one of the plurality of reference inputs 50, wherein the location input 46 grounds a respective reference input 50 when the testing apparatus 30 is inserted into a respective one of the at least two nodes "N" so as to provide a location of a fault.

In such a configuration, the interface 54 remains in electrical contact with the reference inputs 50, wherein when the printed circuit board 10 is energized for testing, a signal is output to each of the reference inputs 50. The testing apparatus 30 is configured to ground the signal at the location output 22 so as to prevent the signal from reaching the respective reference input 50. As such, each time the testing apparatus 30 probes a node "N", the signal at the reference input 50 is zero (0) while the signal at the remaining, or otherwise un-probed nodes "N" is one (1). Thus, the location of a fault is known digitally.

In both aspects, e.g., a method 200 processing an analog signal or a digital signal, the following configurations may be implemented. For instance, the location input 46 may include a second resistor 48 arranged in parallel with the corresponding location trace 52 or the first resistor 24 of the location output 22, as the case may be. The nodes "N" may be dimensioned the same as each other. For instance, the signal output 18, the ground output 20 and the location output 22 may be spaced apart from each other in each of the nodes "N" and the signal output 18, the ground output 20 and the location output 22 are formed by a respective via 28. Alternatively, the signal output 18, the ground output 20 and the location output 22 may be formed by a respective contact 26, the contact 26 being an electrically conductive material.

It should be appreciated that the testing system 100 may be implemented by a robotic system wherein the testing apparatus 30 is held by a robotic arm that is programmed to automatically probe each of the nodes "N". In such an aspect, each fault and node "N" in which the fault is detected may be recorded and provided at the end of the test. In which case, a technician may read the record and perform repairs.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

The invention claimed is:

1. A device for accommodating an electric circuit, the device:

- a printed circuit board;
- at least one electric component mounted on the printed circuit board; and
- at least two nodes disposed on the printed circuit board, and an electric trace electrically coupling the at least two nodes, the at least one electric component electrically coupled to the electric trace, each of the at least two nodes including a signal output, a ground output and a location output, wherein each location output includes a first resistor, and a resistance value of each of the associated first resistors is different from every other first resistor so as to identify a node of the at least two nodes in which a fault is detected.

2. The device of claim 1, wherein each of the at least two nodes are dimensioned the same as each other.

3. The device of claim 2, wherein the signal output, the ground output and the location output are spaced apart from each other.

4. The device of claim 3, wherein the signal output, the ground output and the location output are formed by one of a respective via and a respective contact.

5. The device of claim 1, wherein the printed circuit board further includes a plurality of reference inputs, each of the plurality of reference inputs assigned a location value, and a location trace electrically connecting each of the location output to a corresponding location value.

6. A testing system for detecting a location of a fault, the testing system comprising:

a printed circuit board including at least one electric component and at least two nodes, the at least one electric component and the at least two nodes mounted on the printed circuit board, and an electric trace electrically coupling the at least two nodes, and wherein the at least one electric component electrically coupled to the electric trace, each of the at least two nodes including a signal output, a ground output and a location output;

a testing apparatus including a signal input, a ground input and a location input configured to engage a corresponding signal input, ground input and location output of the at least two nodes; and a controller electrically coupled to the testing apparatus, the controller configured to receive a test signal from the signal input, a reference ground from the ground input and a location from the location input, wherein the controller is further configured to process a signal from the location output and a signal received by the signal input to determine a fault and a location, wherein the controller provides the location of the node in which the fault is detected.

7. The testing system of claim 6, wherein the location output includes a first resistor and a resistance value of each of the first resistors is different from each other so as to identify the location of a node of the at least two nodes in which the fault is detected.

8. The testing system of claim 7, wherein the location input includes a resistor arranged in parallel with the resistor of the location output.

9. The testing system of claim 8, wherein each of the at least two nodes are dimensioned the same as each other.

10. The testing system of claim 9, wherein the signal output, the ground output and the location output are spaced apart from each other.

11. The testing system of claim 10, wherein the signal output, the ground output and the location output are formed by a respective via.

12. The testing system of claim 11, wherein the signal output, the ground output and the location output are formed by a contact, the contact being an electrically conductive material.

13. The testing system of claim 6, wherein the printed circuit board includes a plurality of reference inputs, each of the plurality of reference inputs assigned a location value, and a location trace electrically connecting each of the location output to a corresponding location value, and wherein the testing apparatus further includes an interface for engaging each one of the plurality of reference inputs, wherein the location input grounds a respective reference input when the testing apparatus is inserted into a respective one of the at least two nodes so as to provide a location of a fault.

14. The testing system of claim 13, wherein location input includes a second resistor arranged in parallel with the location trace.

15. The testing system of claim 14, wherein each of the at least two nodes are dimensioned the same as each other.

16. The testing system of claim 15, wherein the signal output, the ground output and the location output are spaced apart from each other.

17. The testing system of claim 16, wherein the signal output, the ground output and the location output are formed by a respective via.

18. The testing system of claim 17, wherein the signal output, the ground output and the location output are formed by a contact, the contact being an electrically conductive material.

19. A method of testing a device, the device including a printed circuit board including an electric trace and a plurality of electronic components, the method comprising:

providing at least two nodes on the electric trace, wherein each of the at least two nodes includes a signal output, a ground output and a location output;

providing a testing apparatus including a signal input, a ground input and a location input; and receiving at a controller a test return signal from the signal input, a reference ground from the ground input and a location from the location input, wherein the controller is configured to provide a location of the at least two nodes in which a signal received by the signal input is a fault.

* * * * *